United States Patent [19]
Jacobs, deceased et al.

[11] Patent Number: 4,581,591
[45] Date of Patent: Apr. 8, 1986

[54] INTEGRATED CIRCUIT TUNABLE CAVITY OSCILLATOR

[75] Inventors: Harold Jacobs, deceased, late of West Long Branch, N.J., by Lydia S. Jacobs, executrix; Robert E. Horn, Middletown; Elmer Freibergs, Toms River, both of N.J.

[73] Assignee: The United States of America as represented by the Secretary of the Army, Washington, D.C.

[21] Appl. No.: 679,969

[22] Filed: Dec. 10, 1984

[51] Int. Cl.$^4$ .............................................. H03B 7/14
[52] U.S. Cl. ................................ 331/96; 331/107 DP
[58] Field of Search ................. 331/86, 90, 96, 107 R, 331/107 DP, 177 R; 333/232, 235

[56] References Cited
U.S. PATENT DOCUMENTS
4,155,051  5/1979  Dydyk ............................ 331/107 R

*Primary Examiner*—Eugene LaRoche
*Assistant Examiner*—G. Wan
*Attorney, Agent, or Firm*—Anthony T. Lane; Jeremiah G. Murray; Maurice W. Ryan

[57] ABSTRACT

An integrated circuit tunable cavity oscillator for extremely high frequency operation in image line waveguide. The oscillator includes a metal base with a cylindrical bore, a dielectric or semiconductor waveguide mounted atop the metal base and having a bore which is continuous with the metal base bore. A Gunn or IMPATT diode is assembled in the metal base bore on top of a drum which is urged upwards toward the waveguide bore by a spring located behind the drum. From above, cavity tuning means including a top disk and a threaded screw cover the waveguide bore and push the diode into the metal base bore to define the cavity height of the coaxial cavity of the oscillator. The waveform, which is set up in the recessed cavity in the metal base, is launched into the waveguide. Thus, a ruggedized, low cost, tunable (by a tuning screw) and low weight oscillator for millimeter wave image line or microstrip operation is obtained. Furthermore, the oscillator diode and cavity defining hardware are easily replaceable.

18 Claims, 5 Drawing Figures

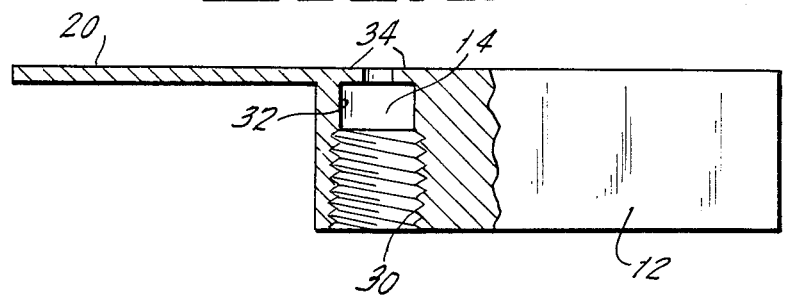
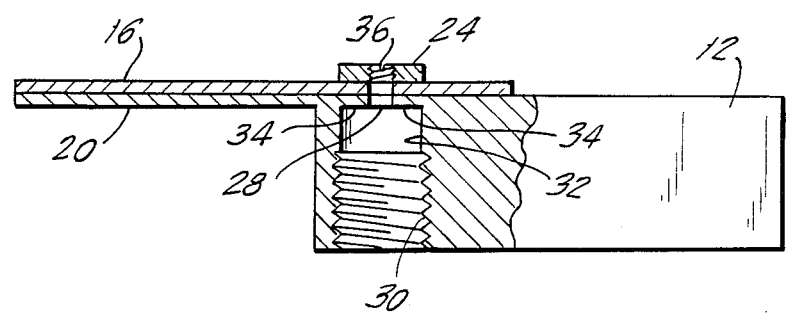
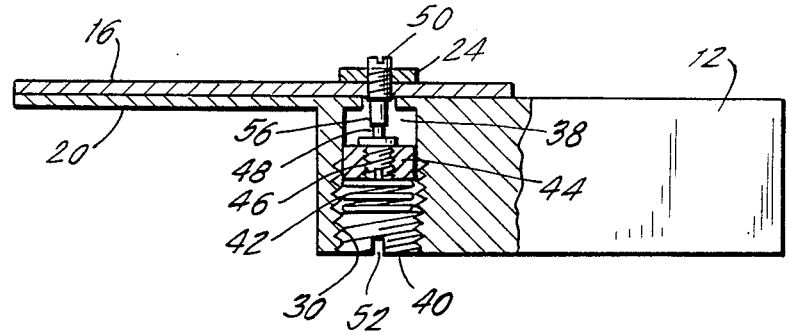

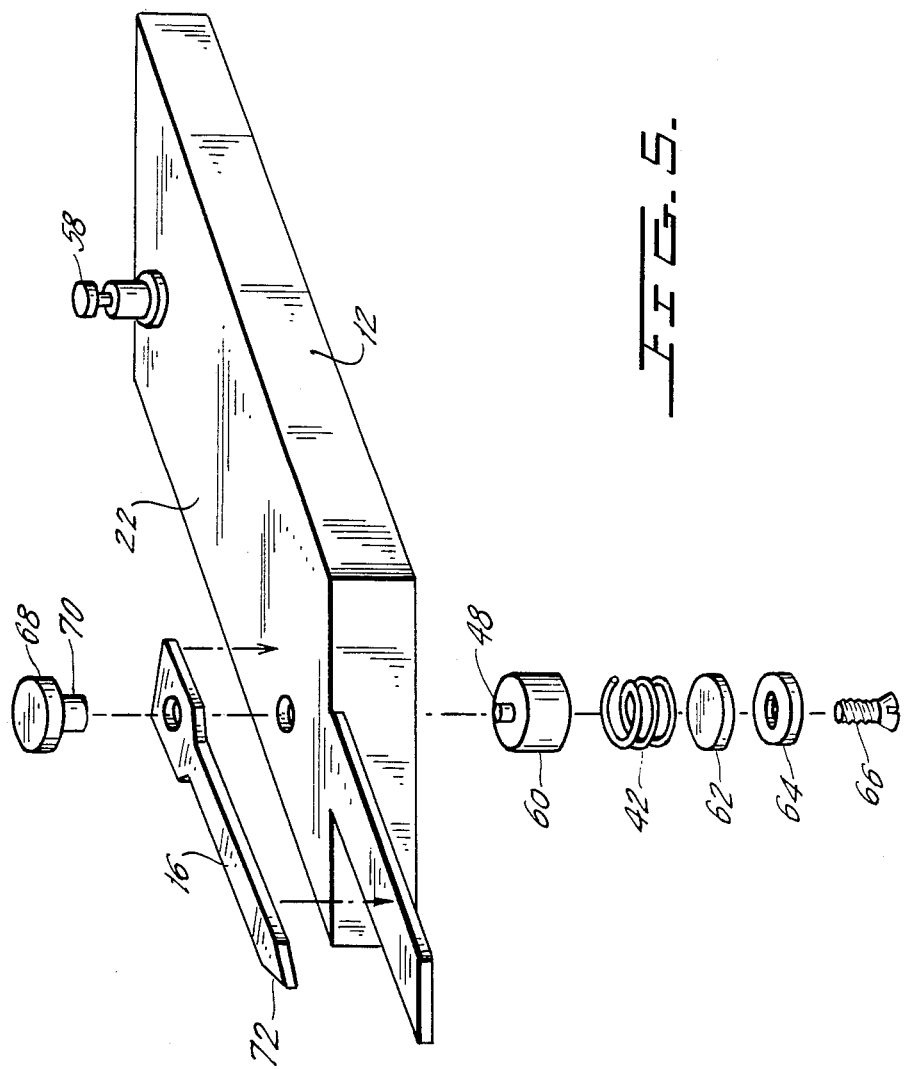

INTEGRATED CIRCUIT TUNABLE CAVITY OSCILLATOR

The invention described herein may be manufactured, used, and licensed by or for the Government of the United States of America for Governmental purposes without the payment to us, or any of us, of any royalties thereon.

BACKGROUND OF THE INVENTION

The present invention relates to low cost integrated circuit oscillator sources and more particularly to a recessed diode in a metal coaxial cavity coupled to image line or microstrip waveguide oscillator sources for use in millimeter-wave integrated circuits.

Radar and communications circuits, as well as other high performance circuits, require oscillator sources which are able to operate at high frequencies. Particularly, the present invention deals with oscillators in the 60-70 Ghz frequency range. Ideally, an oscillator should possess a high "Q" and thus "see" a low impedance and also be capable of providing an output signal of significant power levels in response to an input signal of a predetermined magnitude.

In known manner, extremely high frequency (EHF) oscillators, for operation in the millimeter-wave range, may be obtained by means of a coaxial cavity which is made to resonate by means of a diode which is capable of producing a frequency component of a desired frequency. The dimensions and shape of the cavity define a resonant structure in which a sustained oscillation at one frequency is established. The actual frequency of oscillation is related to the size and shape of the cavity and is described by convention by the so-called $\frac{1}{2}\lambda$ value of the cavity. The prior art shows coaxial cavities in metal structures. They include auxiliary metal-walled circuits for guiding the energy from the cavity to other circuits. Metal-walled structures, however, increase the cost of an oscillator because additional precision machining inside a structural assembly is required. Furthermore, oscillator cavities fabricated primarily in metal are less compatible with dielectric line and/or microstrip circuits and additional means are therefore required for coupling the oscillator to other elements of a circuit. Additionally, metal based oscillators are more expensive, are of greater weight and size thus limiting their applications.

A further limiting factor is that at progressively higher frequencies, skin effect losses in metal-walled structures rise because skin effect losses are proportional to the square root of frequency.

SUMMARY OF THE INVENTION

It is therefore an object of the invention to provide a low cost integrated circuit oscillator source for millimeter-wave integrated circuits (image line, microstrip).

It is another object of the invention to provide oscillator sources which are effective to provide a stable frequency source at least over the 60-70 GHz frequency region.

It is a further object of this invention to provide a rugged, low weight oscillator.

It is a further object of the invention to provide a very high "Q" and a very stable oscillator for use with dielectric waveguides.

It is yet another object of the invention to provide an oscillator with a replaceable coaxial cavity and a Gunn or IMPATT diode.

It is another object of the invention to provide an oscillator with a mechanically tunable frequency.

It is also an object of the invention to provide an oscillator in which oscillations from a metallic coaxial cavity are launched into a dielectric waveguide.

The foregoing and other objects are realized by an integrated circuit oscillator which includes a metal base, of brass for example, and a waveguide which is cemented to the top surface of the metal base and which is of a dielectric or semiconductor material. A bore is provided through the metal base and the waveguide. A waveform which is set up in a resonant coaxial cavity defined in a portion of the metal base bore is launched into the waveguide.

The coaxial cavity and the waveform are provided by a diode and diode support means which are inserted into the metal base bore from an opening located in the metal base opposite the waveguide. The diode support means provide a platform on which the diode (Gunn or IMPATT) is mounted to face the waveguide. From the waveguide direction, a top disk with a threaded opening and a tuning screw in the opening is adapted to enclose the cavity from above and to contact, by means of the screw, the diode and push it into the metal base bore. The tuning screw, whose reach into the metal base bore is adjustable, thus serves to recess the diode into the metal base bore and to provide an electrically conductive path from the top disk to one terminal of the diode. The other terminal of the diode is connected to the diode support means and to the metal base.

The cavity height of the oscillator is the distance between the platform of the diode support means and a shoulder which is defined in the metal base bore in the vicinity of the waveguide. The cavity height is adjusted by means of the tuning screw. The dimensions of the cavity and the adjustability of the tuning screw are such that the cavity height may be varied from 0.015 to 0.100 inches. This cavity height, in addition to an incremental cavity height attributable to the thickness of the waveguide and the shoulder, provides an overall cavity height which is in the order of $\frac{1}{2}\lambda$. For 58.55 GHz, the $\frac{1}{2}\lambda$ for the TEM mode, is 2.56 mm. The overall cavity height of the oscillator according to the invention is of the same magnitude.

Other objects and features of the present invention will become apparent from the following description of preferred embodiments of the invention in conjunction with the accompanying drawings.

BRIEF DESCRIPTION OF THE DRAWINGS

FIG. 2 is a side elevation of the metal base for the oscillator of FIG. 1.

FIG. 3 is a side elevation of the assembly consisting of the metal base, the dielectric waveguide, and the top threaded disk of the oscillator of FIG. 1.

FIG. 4 is a side elevation of the oscillator of FIG. 1.

FIG. 5 is a perspective view of an alternate embodiment for an oscillator in accordance with the invention.

DETAILED DESCRIPTION OF THE DRAWINGS

Figure 1:
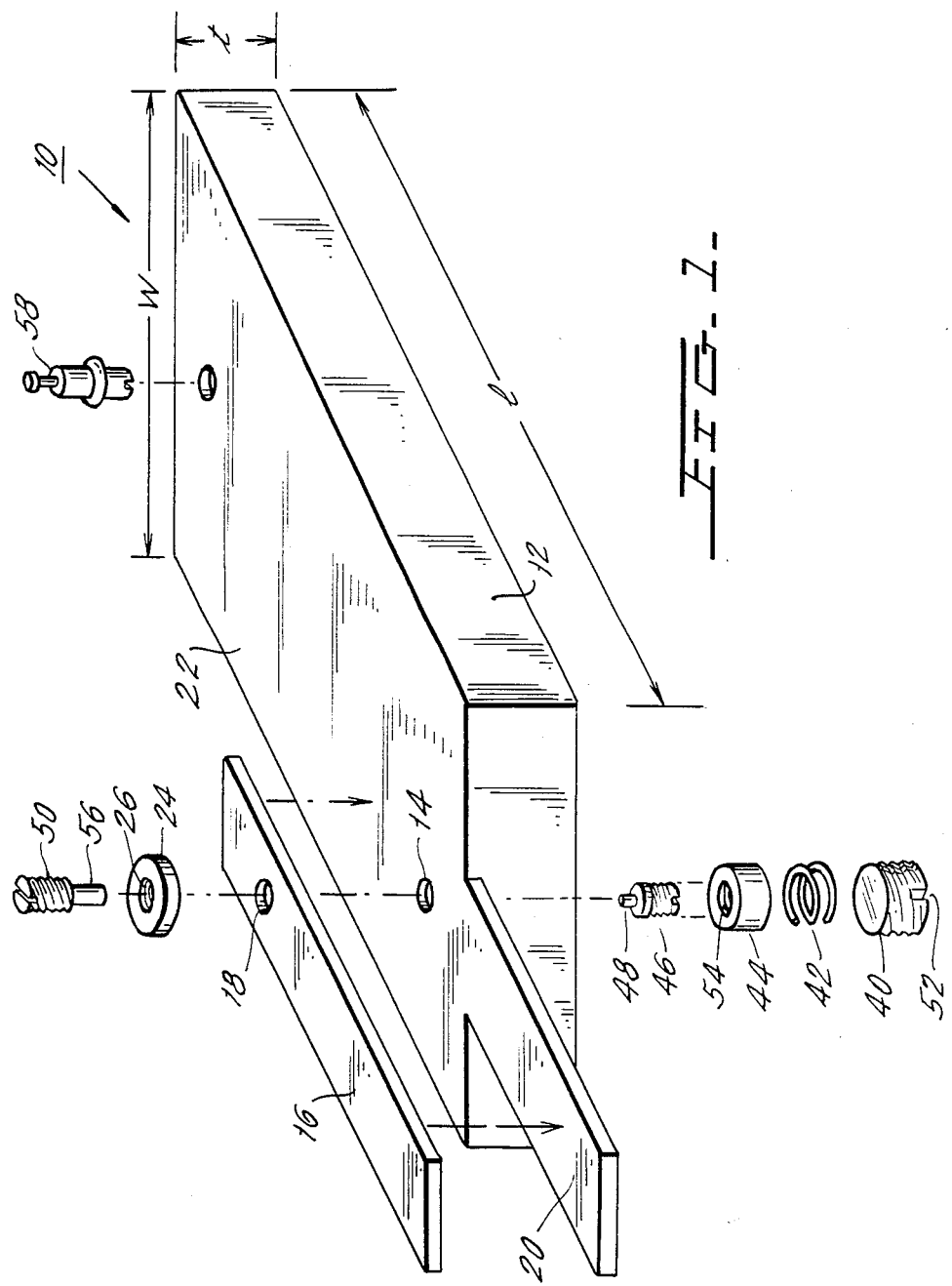
FIG. 1 is a perspective view of the elements of the oscillator according to a first embodiment.

The invention will now be described by reference to the drawings wherein like reference numerals designate identical elements of the invention.

FIGS. 1-4 collectively illustrate a first embodiment of the invention. Referring first to these figures, the integrated circuit oscillator 10, there illustrated, includes a metal base 12 having a cylindrical bore 14 therethrough and a waveguide 16 which is also provided with a cylindrical bore 18. A metal base extension 20 projects out of the upper surface 22 of the metal base 12 to provide a partial platform for the waveguide 16. The extension 20 is narrower in width than the metal base 12. The waveguide 16 is cemented or glued to the upper surface 22 of the metal base 12 and is oriented thereon so that the respective bores 14 and 18 are aligned. The waveguide 16 is also positioned to extend over the metal base extension 20.

A top disk 24 with threaded bore 26 is cemented to the waveguide 16. Again, the threaded bore 26 is aligned with bores 14 and 18. The structure described above, after it is assembled, defines a penetrating bore 28 as shown in FIG. 3.

The metal base 12 and its integral extension 20 are constructed of a metal, for example brass, and serve as a base and cavity enclosure as well as a heat sink for the oscillator 10. The dielectric waveguide 16 is a rectangular body of insulating or high resistivity semiconductor material, preferably silicon. The top disk 24 is of metal, also preferably brass. The top disk 24 is electrically insulated from the metal base by the dielectric waveguide 16.

The penetrating bore 28 running through the metal base 12, the waveguide 16 and the top disk includes, from bottom to top, a threaded section 30 in the metal base 12 followed by smooth wall section 32 and constricting shoulder 34 along which the bore is also smooth walled. The penetrating bore 28 passes through the waveguide 16 and includes a last threaded portion 36 in the bore 26 of top disk 24.

A coaxial cavity 38 is defined in the penetrating bore 28 and a Gunn or IMPATT diode is assembled therein as shown in FIG. 4 and as described below.

40 is a bottom screw plug with a screw driver groove 52 defined therein. 42 is a spring and 44 is a brass drum with a centrally defined threaded bore 54 for receiving therein diode support base 46. A diode 48 is mounted on top of the diode support base 46 so that one terminal of the diode is electrically connected to the base 46 while the other terminal faces upwards into the bore 28.

The diode support base 46 is screwed into the brass drum 44 which is itself mounted into the bore 28 through the threaded section 30. The brass drum 44 is retained in the penetrating bore by the spring 42 and the bottom screw plug 40. The spring 42 additionally acts to push the diode upwards so that, initially, the diode may reach as far as the bore 18 of the waveguide 16.

However, as top tuning screw 50 is threaded into the bore 26 of top disk 24, its stem 56 begins to bear against the diode 48 in its path and to force the brass drum 44 downwards and deeper into penetrating bore 28. Consequently, through the top tuning screw 50 the height and hence the "$\frac{1}{2}\lambda$" dimension of the cavity are adjustable. Furthermore, as shown in FIG. 4, the diode is "recessed" into the metal base 12 and the coaxial cavity is therefore defined in the metal base 12 and not in the dielectric waveguide 16.

FIG. 1 shows a standoff 58 used as a connecting point for the diode bias circuitry. The standoff 58 is supported in the metal base 12 but is electrically insulated therefrom. An electrical conductor (not shown) is provided between the standoff 58 and top disk 24.

In one embodiment of the invention the oscillator's frequency was tunable by about ten percent with the tuning screw 50. Within this frequency range, CW power output at 60 GHz was up to 15 mW of power.

In the above embodiment, the metal base was selected to have a length 1 of 1.5 inches, a width w of 0.75 inch and a thickness t of 0.5 inch (see FIG. 1). The diameters of the tuning screw 50, the bore defined by the shoulders 34 and of the top disk 24 were 0.025 inch, 0.050 inch and 0.120 inch, respectively. The waveguide 16 was of a thickness of 0.040 inch and 1.0 inch in length.

With the dimensions as set forth above, a cavity height of from 0.015 to 0.100 inch was achieved to provide a "$\frac{1}{2}\lambda$" value of nearly the desired 60 GHz frequency of operation.

In the alternate embodiment of FIG. 5, the diode 48 is on the cylinder 60 which is retained in the cavity 14 of the metal base 12 by spring 42, plate 62, washer 64 and bottom screw 66. Top cover disk 68 includes an integral post section 70 which bears against the diode to recess it into the cavity as previously described. However, with the present embodiment, mechanical tuning is not provided.

The waveguide 16 includes a tapered section 72 for impedance matching into metal waveguide (not shown) structure for test and evaluation.

Although the present invention has been described in connection with preferred embodiments, many variations and modifications will now be apparent to those skilled in the art. It is preferred, therefore, that the present invention be limited not by the specific disclosure herein, but only by the appended claims.

What is claimed is:

1. An oscillator, comprising:
   a metal base having a metal base bore therethrough, a top flat surface normal to said metal base bore, and an opening defining a cavity into said metal base bore opposite said top surface;
   a non-metallic waveguide having a waveguide bore therethrough, said waveguide being mounted at said top surface, said waveguide bore being superposed over said metal base bore;
   diode support means in said metal base bore for:
   (a) providing a platform for mounting a diode thereon;
   (b) enclosing said opening of said metal base bore to retain said platform in said metal base bore; and
   (c) resiliently urging said platform upwards toward said waveguide bore; and cavity tuning means for holding said platform away from said waveguide bore and for enclosing said waveguide bore.

2. The oscillator of claim 1 wherein said waveguide is a dielectric waveguide.

3. The oscillator of claim 2 wherein said dielectric is alumina.

4. The oscillator of claim 1 wherein said waveguide comprises semiconductor material.

5. The oscillator of claim 4 wherein said semiconductor material is silicon.

6. The oscillator of claim 1 wherein said metal base is a brass metal base.

7. The oscillator of claim 1 wherein said cavity tuning means comprises a top disk having a threaded top disk bore and a tuning screw threadedly receivable in said top disk bore, said top disk being mounted at said waveguide, said top disk bore being superposed over said waveguide bore, said tuning screw being adapted to engage said diode suppport means and to position said diode at positions in said metal base bore determined by the relative position of said tuning screw in said top disk.

8. The oscillator of claim 7 wherein said waveguide is cemented or glued to said metal base and said top disk is cemented or glued to said waveguide.

9. The oscillator of claim 8 wherein said diode support means comprises:
 (a) a platform having a top side for mounting a diode thereon, said platform being slidably mounted in said metal base bore and oriented so that said top side faces said waveguide;
 (b) a spring in said metal base for urging said platform toward said waveguide; and
 (c) a bottom plug threadedly receivable in said metal base bore to enclose said opening of said metal base bore.

10. The oscillator of claim 9 wherein said metal base bore is a cylindrical bore and wherein said platform comprises a cylindrical drum with a centrally located threaded bore and a diode base having a threaded stem which is receivable in said threaded bore of said drum and a top surface on said diode base opposite said threaded stem for mounting said diode thereon.

11. The oscillator of claim 10 wherein a shoulder is defined in said metal base bore adjacent said waveguide, said shoulder constricting said bore to have a diameter which is equal to bore diameters associated with said waveguide bore and said top disk bore.

12. The oscillator of claim 1 wherein said diode support means includes means for providing a first electrically conductive path from said metal base to a first terminal of said diode and wherein said cavity tuning means include means for providing a second electrically conductive path from said top disk to a second terminal of said diode.

13. The oscillator of claim 12 wherein said diode is a Gunn diode.

14. The oscillator of claim 12 wherein said diode is an IMPATT diode.

15. The oscillator of claim 12 wherein said cavity tuning means comprises a top disk having a threaded top disk bore and tuning screw threadedly receivable in said top disk bore, said top disk being cemented to said waveguide, said top disk bore overlapping said waveguide bore, said tuning screw being adapted to engage said diode at said second terminal thereof to position said diode in said bore of said metal base and to complete said electrically conductive path from said top disk to said second terminal of said diode.

16. The oscillator of claim 15 further including a standoff mounted at said metal base and electrically insulated therefrom and a conductor extending from said standoff to said top disk.

17. The oscillator of claim 11 wherein said cylinder drum and said shoulder define a cavity height in said metal base bore, said cavity height being measured between said drum and said shoulder and wherein said tuning screw is adapted to vary said cavity height from 0.015 to 0.100 inches.

18. The oscillator of claim 1 wherein said diode support means comprises:
 (a) a cylinder with a top surface for mounting said diode, said cylinder being slidably received in said metal base cavity, said top surface facing said waveguide;
 (b) a spring and a plate in said metal base bore adjacent said cylinder and opposite said top surface thereof;
 (c) a washer with a threaded bore cemented to said opening of said metal base; and
 (d) a bottom screw receivable in said washer to bear against said plate to urge said cylinder in a direction toward said waveguide in said metal base bore; said cavity tuning means comprises a top cover disk with an integral post section depending perpendicularly therefrom, said post section being fitted through said waveguide bore to engage said diode to position said diode at a predetermined distance from said top cover disk to define a cavity height of said oscillator.

* * * * *